(12) United States Patent
Kim et al.

(10) Patent No.: US 8,069,000 B2
(45) Date of Patent: Nov. 29, 2011

(54) AGING STATUS DIAGNOSTIC APPARATUS FOR POWER CONVERSION SYSTEM, AND METHOD THEREOF

(75) Inventors: Deuk Soo Kim, Seoul (KR); Rae Young Kim, Seoul (KR)

(73) Assignee: Powertron Engineering Co., Ltd., Seoul (KR)

( * ) Notice: Subject to any disclaimer, the term of this patent is extended or adjusted under 35 U.S.C. 154(b) by 0 days.

(21) Appl. No.: 12/602,629

(22) PCT Filed: Aug. 22, 2008

(86) PCT No.: PCT/KR2008/004898
§ 371 (c)(1),
(2), (4) Date: Jan. 25, 2010

(87) PCT Pub. No.: WO2009/028837
PCT Pub. Date: Mar. 5, 2009

(65) Prior Publication Data
US 2010/0161259 A1    Jun. 24, 2010

(30) Foreign Application Priority Data

Aug. 29, 2007 (KR) .................. 10-2007-0087086
Jun. 10, 2008 (KR) .................. 10-2008-0054259

(51) Int. Cl.
*H02H 7/122* (2006.01)
*G06F 17/00* (2006.01)
(52) U.S. Cl. ............. 702/63; 702/60; 702/64; 702/65; 702/126; 363/50; 363/55
(58) Field of Classification Search .............. 702/63, 702/60, 58, 64, 65, 126
See application file for complete search history.

(56) References Cited

U.S. PATENT DOCUMENTS

| 6,850,820 B2 | 2/2005 | Tajima |
| 6,888,729 B2 | 5/2005 | Maekawa et al. |

(Continued)

FOREIGN PATENT DOCUMENTS

| KR | 10-2005-0037714 A | 4/2005 |
| KR | 1020050037714 A | 4/2005 |
| KR | 200399135 Y1 | 10/2005 |

(Continued)

OTHER PUBLICATIONS

International Search Report for PCT/KR2008/004898, Jan. 31, 2009.

*Primary Examiner* — Hal Wachsman
(74) *Attorney, Agent, or Firm* — LRK Patent Law Firm

(57) ABSTRACT

An aging status diagnostic apparatus for a power conversion system and diagnosing method thereof are provided. The apparatus includes an output current sensing means detecting output current of an inverter switching module; and a measurement and diagnosis means receiving the output current, calculating one or more average values of the output current over one period, and magnitude or effective value of each harmonic of the output current, and determining whether aging of the inverter switching module has occurred. Furthermore, the measurement and diagnosis means determines that the aging of the inverter switching module has occurred if the average value of the output current over one period increases by a value equal to or greater than a predetermined range and/or an even order harmonic or a specific order harmonic based on FFT (Fast Fourier Transform) of the output current increases by a value equal to or greater than a predetermined range.

19 Claims, 8 Drawing Sheets

U.S. PATENT DOCUMENTS

| | | | |
|---|---|---|---|
| 7,392,143 B2 * | 6/2008 | Jayabalan et al. | 702/60 |
| 2006/0152224 A1 * | 7/2006 | Kim et al. | 324/430 |
| 2007/0090801 A1 * | 4/2007 | Kim | 320/128 |
| 2010/0036628 A1 * | 2/2010 | Plestid | 702/63 |

FOREIGN PATENT DOCUMENTS

| | | |
|---|---|---|
| KR | 10-0546246 B1 | 1/2006 |
| KR | 10-0577828 B1 | 5/2006 |
| WO | WO 2004099791 A2 * | 11/2004 |

\* cited by examiner

AGING STATUS DIAGNOSTIC APPARATUS FOR POWER CONVERSION SYSTEM, AND METHOD THEREOF

CROSS REFERENCE TO RELATED APPLICATION

This application is a National Stage of International Application No. PCT/KR2008/004898 filed Aug. 22, 2008, claiming priorities based on Korean Patent Application No. 10-2007-0087086 filed Aug. 29, 2007, and Korean Patent Application No. 10-2008-0054259 filed Jun. 10, 2008, the contents of which are incorporated herein by reference in their entirety.

TECHNICAL FIELD

In the line with the demands of the information society era, currently, power conversion systems, such as various types of rectifiers, inverters and Direct Current (DC) converters, are widely used in various industrial fields, including the information and communication field. Such power apparatuses act as basic core components for supplying emergency power or converted power. In particular, a power conversion system, such as an Uninterruptable Power Supply (UPS) or a communication power supply, which is used for supplying emergency power in the case of a power failure of the commercial power provider (Electric Power Corporation), has a very strong possibility of bringing about economic and social loss in the event of an unexpected failure or accident, and always requires being in reliable operation.

The present invention relates to an apparatus capable of diagnosing the aging state of a power conversion system at ordinary times to ensure the reliability of a power conversion system having an inverter circuit, such as a UPS. In particular, the present invention relates to an aging status diagnostic apparatus and method for power conversion system, which measures and monitors a specific harmonic by analyzing the output current waveform of an inverter switching module, that is, the principal circuit of the power conversion system, and measures an ESR value or a loss angle tan δ by causing a measurement current signal to flow through an electrolytic capacitor installed on a DC bus of power conversion system, thereby being able to diagnose the erroneous operation or damage of the power conversion system in advance or monitor and diagnose an abnormal state attributable to the aging or degradation of a battery system in advance.

BACKGROUND ART

Recently, in line with the demand of the day, the necessity for safety against the failure of a power conversion system has been increasing, with the result that research into the diagnosis of the aging of power conversion systems has been actively conducted and the results of the research have been presented in various documents.

Methods presented in recent documents focus on the determination of the cause or state of a failure after the failure has occurred in such apparatuses.

Such methods include a method of estimating the abnormality of a conversion device module or equipment through the signal processing of input current and the spectral analysis of an operating frequency, and a method of extracting some of various variables related to the abnormality of a power semiconductor switch or the abnormality of a controller, a filter capacitor, or an output stage, analyzing the signals, and presenting abnormality results.

Korean Patent Application No. 10-2003-0072963, filed on Oct. 20, 2003 in Korea, published on Apr. 25, 2005, and entitled Apparatus for diagnosing state of power conversion system, is an example of the representative results of research into a method of diagnosing the aging or degradation of a power conversion system. This diagnosing method is configured to analyze the voltage signals of the input and output terminals of a power conversion system or monitor variation in the capacitance of a filter capacitor and variation in ripple voltage, thereby being able to monitor the erroneous operation or damage of the power conversion system and monitor and diagnose an abnormal situation attributable to the aging or degradation of the apparatus in advance.

Furthermore, Korean Utility Model Registration No. 20-0399135, filed on Aug. 7, 2005 in Korea, registered on Oct. 12, 2005, and entitled UPS using individual battery management device, presents a scheme capable of optimally charging and discharging the battery of a power conversion system, such as a UPS, and managing the internal characteristics thereof.

DISCLOSURE

Technical Problem

In general, a method of maintaining a power conversion system is configured to set a durable period and replace an old part when the durable period has elapsed, thereby reducing the possibility of the occurrence of an accident and preparing for an accident arising from the use of the power conversion system. However, the protection of the entire system through the detection of a sign of abnormality of the power conversion system and the replacement of an aged power source in advance is a task to be solved in the future. Since a power conversion system is a complicated system formed of a number of parts, it is difficult to determine the general aging state of the system using some specific and limited extracted signals.

However, the conventional aging status diagnostic methods have a disadvantage in that they are limited to a function of providing notification of an accident situation rather than monitoring a state. Furthermore, although they can monitor and diagnose an abnormal state attributable to the aging or degradation of an apparatus in advance, a component signal that is extracted at the input and output terminals of the monitoring-target power conversion system and is related with an aging state may vary according to driving conditions or environmental variation, with the result that measurement accuracy may be low, and thus measurement discrimination may be low.

Furthermore, since various types of detection circuit units are newly installed in the monitoring-target power conversion system, it is difficult in practice to apply them to power conversion systems in operation, with the result that there is a disadvantage in that the industrial usability thereof is low.

Technical Solution

Accordingly, the present invention has been made keeping in mind the above problems occurring in the prior art, and an object of the present invention is to provide an aging status diagnostic apparatus and method for a power conversion system that not only monitors an abnormality attributable to the aging of an inverter switching module, which is the core part of the power conversion system, in such a way as to extract the current waveform of the output stage of the inverter switching module and measure and monitor the average value of the current waveform and or/and magnitude or an effective value of each harmonic based on FFT, or harmonic contents of ripple current which flows through DC bus of power conversion system but also diagnoses the aging state of an electrolytic capacitor, which belongs to parts of the power conversion system and may be degraded early, in such a way as to cause a measurement current signal to flow through the electrolytic capacitor installed on the DC bus of the power conversion system, extract an impedance voltage signal and calculate an Equivalent Series Resistance (ESR) value or a loss angle tan δ.

Another object of the present invention is to provide an aging status diagnostic apparatus and method for a power conversion system that is capable of monitoring an abnormal state attributable to the aging or degradation of a battery, which is an essential component of the power conversion system.

Advantageous Effects

As described above, the aging status diagnostic apparatus and method for a power conversion system according to the present invention is not configured to use a method of determining an erroneous operation based on the analysis of the input and output voltage of an apparatus and the analysis of a current signal or to install a signal measurement circuit on input and output stages, analyze a signal measured through the signal measurement circuit and diagnose a sign of abnormality based on results of the analysis, unlike the conventional methods, but is configured to connect sensing lines to a portion of the power conversion system in operation near the DC bus thereof and easily install a current sensing means, formed in a hook configuration, on the output circuit stage of an inverter switching module, with the result that it is easy to install the diagnostic apparatus, the analysis or calculation of a signal can be relatively simplified, and reliability can be achieved due to the measurement discrimination thereof.

Furthermore, measurement accuracy and discrimination can be improved through the extraction, analysis and monitoring of the waveforms of characteristic components related to the aging of an electrolytic capacitor or a switching semiconductor device (which is a portion that belongs to the parts of a conversion apparatus and may be degraded early), which is not present in the conventional methods.

Furthermore, the calculation time of a control and calculation means is appropriately arranged, with the result that internal resistance values can be simultaneously calculated from the measurement current signals and extracted internal impedance voltage waveforms of battery groups or cells, and then the aging state of a battery system can be determined based on the internal resistance values.

Accordingly, there are advantages in that the erroneous operation or damage of a power conversion system can be accurately monitored, and an abnormal state attributable to the aging or degradation of the apparatus can be accurately monitored locally or remotely in advance and whether the degradation of the apparatus has occurred can be diagnosed in advance.

BEST MODE

Figure 1:
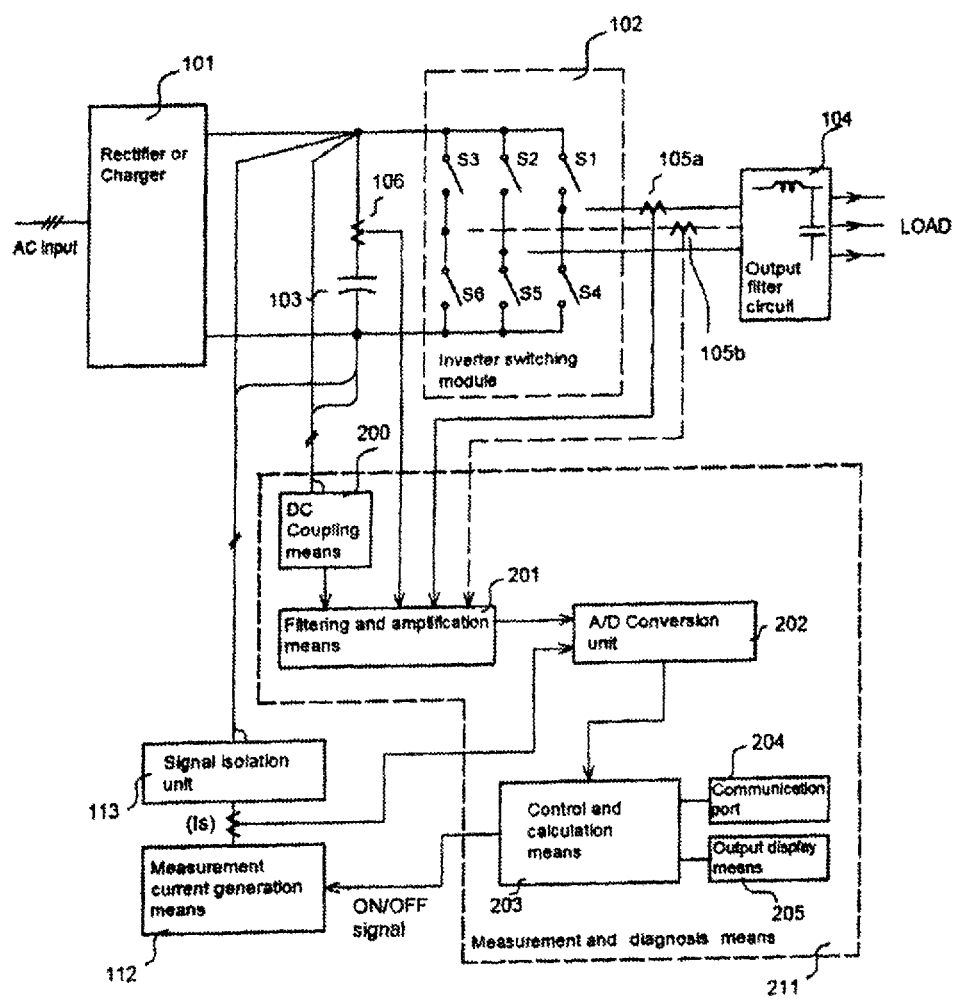
FIG. 1 is a configuration diagram of an aging status diagnostic apparatus for a power conversion system according to the present invention.

In order to accomplish the above objects, the present invention provides an aging status diagnostic apparatus for a power conversion system, including a first or second current sensing means installed on the output stage line of a single-phase or three-phase inverter switching module and configured to detect the output current of the inverter switching module, and a measurement and diagnosis means configured to receive the output current waveform of the inverter switching module and/or an impedance voltage signal induced to the electrolytic capacitor, and determine whether aging of the power conversion system has occurred by extracting and calculating components which are related with an aging state.

Furthermore, in order to analyze the other characteristic components related to an abnormal state or an aging state of a charging unit or the electrolytic capacitor, it is preferable that the aging status diagnostic apparatus further comprises a third current sensing means capable of sensing the ripple current of the electrolytic capacitor, and a measurement current generation means connected to + and terminals of the electrolytic capacitor and configured to generates a measurement current signal to be supplied to the electrolytic capacitor through a signal isolation unit.

Furthermore, in order to measure and diagnose the aging state of a battery system, which is an essential part of an Uninterrupted Power Supply (UPS), simultaneously, it is preferable that the aging status diagnostic apparatus further include a relaying means switching the measurement current signal which has generated from the measurement current generation means to the battery to be measured and a characteristic data signal of the battery to be measured to the measurement and diagnosis means.

When the capacity of a battery system is high, the number of battery units (cells) of the battery system is more than several hundreds, in which case sensing circuits must be installed for respective battery cells to measure the aging state of the respective battery cells, with the result that the installation of the sensing circuits is complicated and a large number of monitoring circuits is required, thus resulting in complication. For the increase in economic effect, a method of dividing a battery system to be measured into the string groups having an appropriate size, measuring an internal impedance effective value (resistance component) and voltage for each of the string groups and diagnosing the aging state thereof may be more preferable.

Meanwhile, the measurement and diagnose means includes a filtering and amplification means for filtering out noise components or noise signals in an unnecessary frequency band included in the output current of an inverter switching module or buffering, amplifying or shifting a signal level of the output current, an Analog-to-Digital (A/D) conversion means for converting an output current signal, received from the filtering and amplification means, into the digital signal, and a control and calculation means for performing control so that various types of data signals necessary for calculation can be extracted or transformed and appropriately input to the MPU, and performing digital calculation.

Furthermore, in order to diagnose the aging status of a DC bus electrolytic capacitor, it is preferred that the aging status diagnostic apparatus further comprises a DC coupling means for filters out only impedance voltage signals, which are AC components, from DC voltage that is extracted at the + and terminals of the DC bus electrolytic capacitor.

Furthermore, it is preferred that the aging status diagnostic apparatus further comprises a serial or TCP/IP communication port for receiving an output signal including a calculation result of the control and calculation means and communicating with an external monitoring device (PC or server, etc) which manages a diagnosing result of the power conversion system, and an output display means.

In order to accomplish the above objects, the present invention provides an aging state diagnostic method for a power conversion system, comprising the steps of, in the aging state diagnosing apparatus, extracting output current waveform of an inverter switching module of the power conversion apparatus, and calculating and analyzing an average value or/and magnitude or effective value of each harmonic based on FFT from the output current waveform, further comprising the steps of causing a measurement current signal having a predetermined frequency to flow through a DC bus electrolytic capacitor connected to a DC bus of the power conversion system, extracting an impedance voltage waveform corresponding to the measurement current signal, calculating ESR value or a loss angle tan δ by using the measurement current signal and the extracted impedance voltage waveform, and analyzing and diagnosing whether the malfunction or aging of the power conversion system has occurred from the average value, magnitude or effective value of each harmonic based on FFT, the ESR value or the loss angle tan δ.

Furthermore, as another extracting component in determining the aging status of a charging unit or the electrolytic capacitor, it is preferred that the aging state diagnostic method further comprises analyzing magnitude of each harmonic based on FFT of the detected ripple current.

Furthermore, a method of measuring and monitoring the aging the aging state of a battery system, which is an essential part of a UPS, includes selectively controlling the relaying means to switch a battery group or cell to be measured to the measurement and diagnosis means, causing a measurement current signal having a predetermined frequency to flow through the battery group or cell to be measured, selected by the relaying means; extracting an internal impedance voltage waveform corresponding to the measurement current signal; calculating an internal resistance value from the extracted internal impedance voltage waveform induced by the measurement current signal and; and determining the aging state of the battery system based on the calculated internal resistance value. At the step of extracting the internal impedance voltage waveform, the measurement and calculation of the battery cell voltage is performed together.

MODE FOR INVENTION

Embodiments of the present invention will be described in detail below with reference to the accompanying drawings.

FIG. 1 is a diagram schematically showing the construction of an aging status diagnostic apparatus for a power conversion system according to an embodiment of the present invention.

Now, a detailed description thereof will be given based on FIG. 1. The aging status diagnostic apparatus for a power conversion system according to the present invention includes a first or second output current sensing means 105a or 105b, and a measurement and diagnosis means 211 for receiving extracted signals and measuring, calculating and diagnosing the aging state of a power conversion system.

Furthermore, in order to diagnose and analyze the aging state of a charging or the electrolytic capacitor, it is preferable that the aging status diagnostic apparatus for a power conversion system further include a third current sensing means 106 capable of sensing the ripple current of an electrolytic capacitor, and a signal isolation unit 113 or measurement current generation means 112.

The first or second output current sensing means 105a or 105b is inserted into and installed on the output stage line of a single-phase or three-phase inverter switching module 102, and can detect the output current waveform of the inverter switching module 102 at ordinary times or when necessary. It is preferred that the current sensing means be designed in a hook configuration so that it can be installed on the output stage line without the cutting of the power line and can detect the current waveform of a line to be measured.

The measurement and diagnosis means 211 may basically include a filtering and amplification means 201, an Analog-to-Digital (A/D) conversion unit 202, and a control and calculation means 203 composed of an MCU and a peripheral circuit, and may further includes a DC coupling means 200 to diagnose and analyze the aging state of the charging unit or the electrolytic capacitor.

Furthermore, it is preferred that the measurement and diagnosis means 211 further include a serial communication or TCP/IP communication port 204 for communicating with an external monitoring device, or an output display means 205.

The DC coupling means 200 passes out only impedance voltage signals, which are AC components, from DC voltage that is extracted at the + and terminals of the DC bus electrolytic capacitor. The DC coupling means 200 may include a DC coupling capacitor and a resistance element, as well known. It is more preferable to configure the DC coupling means 200 so that it functions to divide the voltage of the output DC stage into an appropriate size that can be processed by the filtering and amplification means 201 when the DC voltage of the output DC stage of the rectifier/charger 101 is high.

The filtering and amplification means 201 filters out impedance voltage signals or ripple current signals extracted from the electrolytic capacitor 103, or/and noise components included in the output current waveform of the inverter switching module 102 obtained through the first or second output current sensing means 105a or 105b.

Furthermore, the filtering and amplification means 201 may be further provided with a filtering function, such as the function of a bandpass means, and filter out noise signals in frequency bands that are included in the signal and are not necessary for or disturb the calculation of aging diagnosing components.

It is apparent that the DC voltage of the DC bus electrolytic capacitor can be measured by inputting directly to the filtering and amplification means 201 without the intervention of the DC coupling means 200.

The signals filtered out by the filtering and amplification means 201 are amplified to an appropriate level and input to the A/D conversion unit 202. Since the commercial model of the A/D conversion unit 202 actually has two power inputs (for example, + and −12V) or a single power input (for example, +5V), the filtering and amplification means 201 may amplify or shift the level of the signals so that the level of the signals is consistent with the input stage level of the A/D conversion unit 202.

Furthermore, the filtering and amplification means 201 may have a function of buffering the above-described extracted or obtained signals.

The control and calculation means 203 has a function of performing control so that various types of data signals necessary for calculation can be created or transformed and appropriately input to the MPU, and is formed of an embedded circuit having a relatively simple function such as an MCU. The control and calculation means 103 receives a digital signal from the A/D conversion unit 202, and 1) calculates the average value of the output current of the inverter switching module 102 over one period and/or the magnitude or effective value of each harmonic based on Fast Fourier Transform (FFT), 2) calculates the ESR value or loss angle tan δ of the electrolytic capacitor 103, 3) may calculate the magnitude of each harmonic based on FFT by analyzing the ripple current of the electrolytic capacitor detected by the third current sensing means when necessary, and 4) may calculate an internal resistance value or a cell voltage value for each group of a battery system when necessary, thereby diagnosing the aging state of the power conversion system.

In another embodiment of the present invention, an aging status diagnostic apparatus for the power conversion system includes the first or second output current sensing means 105a or 105b and the measurement and diagnosis means 211 without including the signal isolation unit 113 and the measurement current generation means 112 in order to simplify the construction thereof and reduce the manufacturing cost thereof. The aging status diagnostic apparatus for the power conversion system can diagnoses the aging state of the inverter module, which is the core circuit of the power conversion system, by closely calculating and analyzing, from various aspects, the average value of the output current of the inverter switching module 102 over one period as long as the capability of the MCU allows, and/or the magnitude or effective value of each harmonic based on FFT over the upper and lower half periods of the output current (an upper half period and a lower half period, that is, one period), and the occurrence of a specific harmonic (an even order harmonic or a specific order harmonic) based on FFT analysis.

In this case, it is difficult to precisely analyze the aging state of the electrolytic capacitor disposed on the DC stage, and thus the reliability of the power conversion system can be improved by replacing the apparatus with a new apparatus when a durable period has elapsed or the operating temperature thereof is equal to or higher than a design value.

Since the inverter switching module 102 is the most important component of the power conversion system, has a complicated circuit configuration, and has a strong possibility of generating a critical fault, such as an arm short circuit, due to the erroneous operation or aging of semi-conductor switching elements S1 to S6 or a control circuit, the basic part of the diagnosis of the aging state of the power conversion system is to extract factors related to the abnormality or aging of the inverter switching module 102, which is the primary purpose of the diagnosis.

Figure 2:
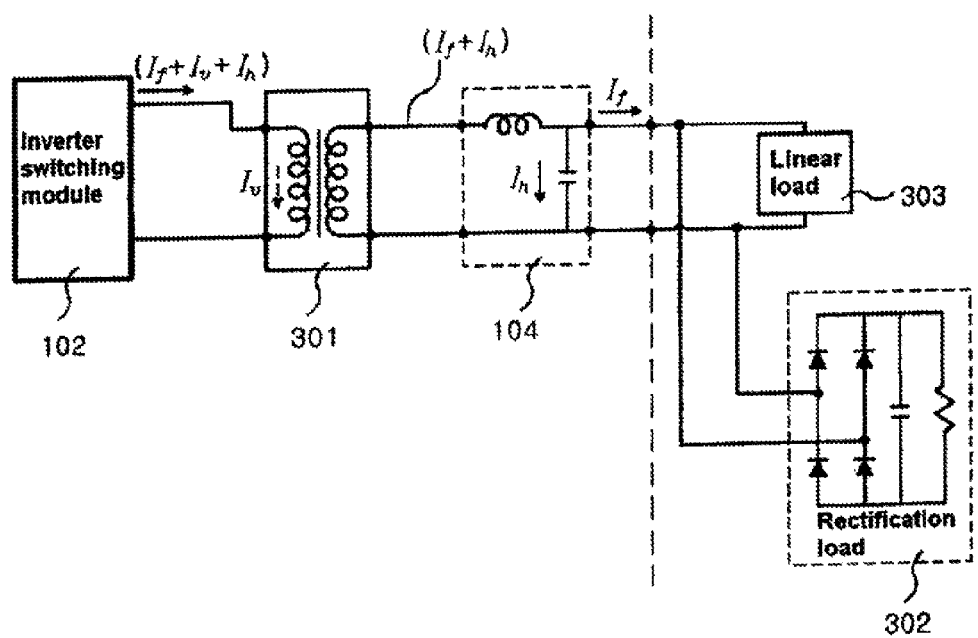
FIG. 2 is a diagram showing the flow of the output current of the inverter switch module in respective stages in the power conversion system.

FIG. 2 shows the path along which respective harmonic and current components included in an output current component flow through the output transformer or output filter circuit 104 when the current component output from the inverter switching module 102 flows to a load side.

The DC component Iv included in the output current component forms deviation current on and allows the deviation current to flow through the primary circuit side of the output transformer, a harmonic current component $I_h$ is bypassed in the output filter circuit 104, and only fundamental wave current $I_f$ flows to a final load side. Although FIG. 2 shows the output circuit stage of the inverter unit of the power conversion system, which is widely used, only fundamental current $I_f$ flows to a final load side in the case in which the output filter circuit 104 is designed to be disposed on the primary circuit side of the output transformer.

Accordingly, since the DC component Iv and the harmonic current component $I_h$ included in the output current of the inverter switching module 102 are not influenced regardless of variation in load current and the output voltage waveform mainly varies with the characteristic abnormality or aging status of the inverter switching module 102, the aging status of the power conversion system can be diagnosed by analyzing the magnitude of the DC component Iv or harmonic current component $I_h$ of the output current of the inverter switching module 102.

Meanwhile, the load of the power conversion system mainly includes a linear load, such as an electric device, and a rectifier load. In the case in which the current of a capacitor input-type rectifier load 302 is included in load current, odd lower order harmonics, such as third, fifth and seventh order harmonics, are mainly included in load current components if a waveform over upper and lower half periods is symmetrical. These harmonics are somewhat absorbed by the output filter circuit 104, but most of the odd lower order harmonics (for example, third, fifth and seventh order harmonics) flow through the inverter switching module 102. Accordingly, variation in the magnitude or effective value of each harmonic, other than the odd lower order harmonics, which is included in the output current of the inverter switching module 102 generated by the flow of the load current is measured, and it is determined that aging has occurred if the content thereof is greater than that in a normal state.

In the case in which the widths of the upper and lower half periods of the load current waveform are different from each other, the even order harmonic is included in the load current when the load current waveform is analyzed through FFT. Since this phenomenon chiefly results from the inferiority of the control state of the inverter switching module 102, it can be determined that the failure or aging of the power conversion system has occurred if the above even order harmonics are measured.

The inverter switching module 102 outputs an AC voltage waveform having a sine wave PWM form by performing PWM control on DC voltage. When switching characteristic values, such as the ON-resistances of the upper and lower arms of the switching element S1, S2, S3, S4, S5 or S6, increase or vary from each other due to aging, the output voltage wave forms of the inverter switching module 102 over upper and lower half periods are asymmetrical to each other, with the result that the output current flowing into the output filter circuit 104 and the output transformer has the DC component Iv. As a result, the current average value over one period of the AC voltage waveform increases, and the aging state or abnormality of the inverter switching module 102 can be diagnosed by measuring the increasing current average value.

Figure 6A:
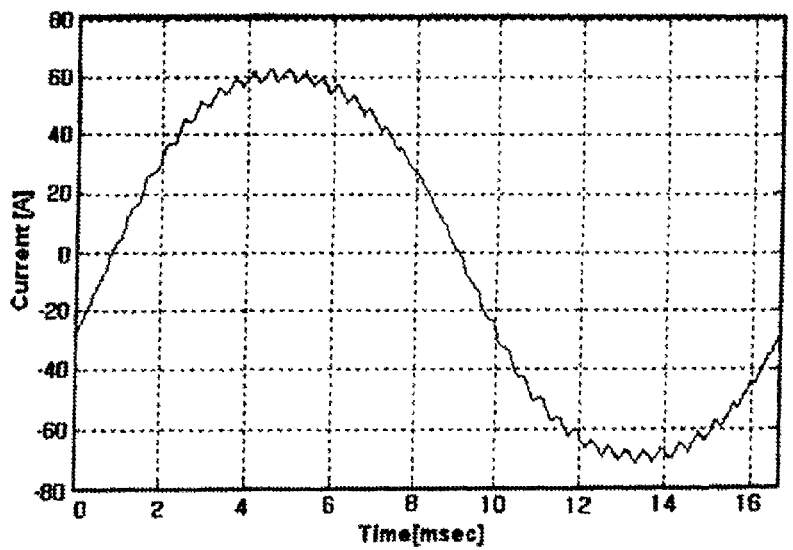
FIG. 6A is a diagram showing an output current waveform when the aging of an inverter switching element has occurred.
Figure 6B:
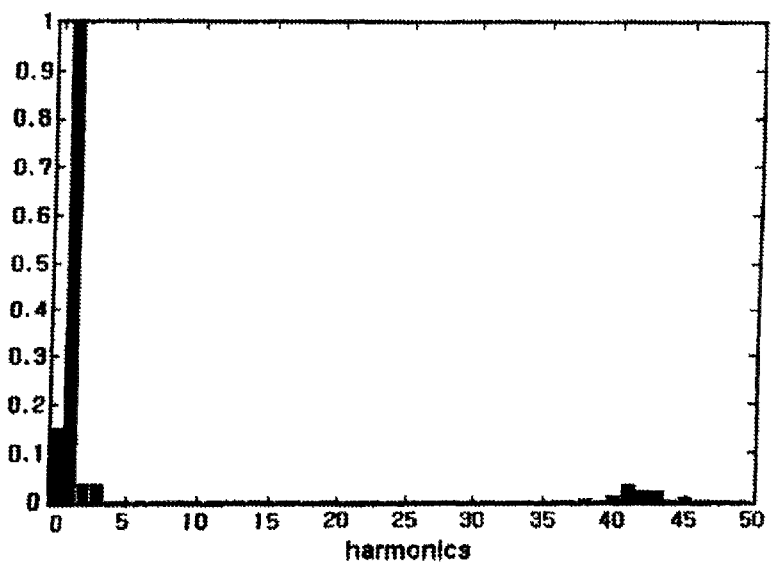
FIG. 6B is a diagram showing the magnitude of each harmonic based on the FFT analysis of the output current waveform.

FIG. 6 shows an output current waveform (on the top) obtained through analysis using simulation and the magnitude of each harmonic obtained through FFT analysis (on the bottom) in the case in which some of the semi-conductor switching elements S1 to S6 are aged, and thus ON-resistance increases. It can be seen that, in this case, the average value of the output current of the inverter switching module 102 increases, with the result that a DC component is included therein and even lower order harmonics occur.

Furthermore, when the switching elements S1 to S6 of the inverter switching module 102 or the semi-conductor control circuit are aged or an erroneous operation occurs due to the failure of a control power source (for example, a DC/DC converter or an SMPS) for supplying power to the control circuit, the output waveform of the inverter switching module 102 is formed such that the sine wave PWM voltage waveform over upper and lower half periods is deformed from a normal waveform and specific order harmonic voltage that does not appear when normal state is included therein. With regard to such specific order harmonic voltage, the output transformer and the output filter circuit 104 have low impedance compared with a fundamental wave, with the result that the large specific order harmonic current flows through the output filter circuit 104 due to the harmonic voltage and the specific order harmonic current over upper and lower half periods (that, one period) increases compared with that in a normal state. As a result, the aging state or abnormality of the inverter switching module 102 can be diagnosed by measuring and calculating the magnitude or effective value of each of the specific order harmonics over upper and lower half periods (that is, one period) through the FFT analysis of the output current waveform.

Figure 7A:
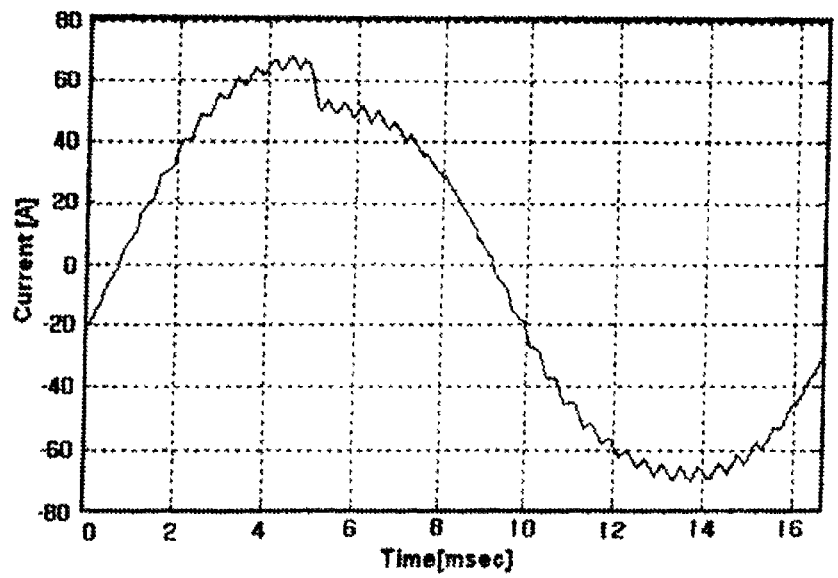
FIG. 7A is a diagram showing an output current waveform when a failure attributable to the aging of an inverter switch module.
Figure 7B:
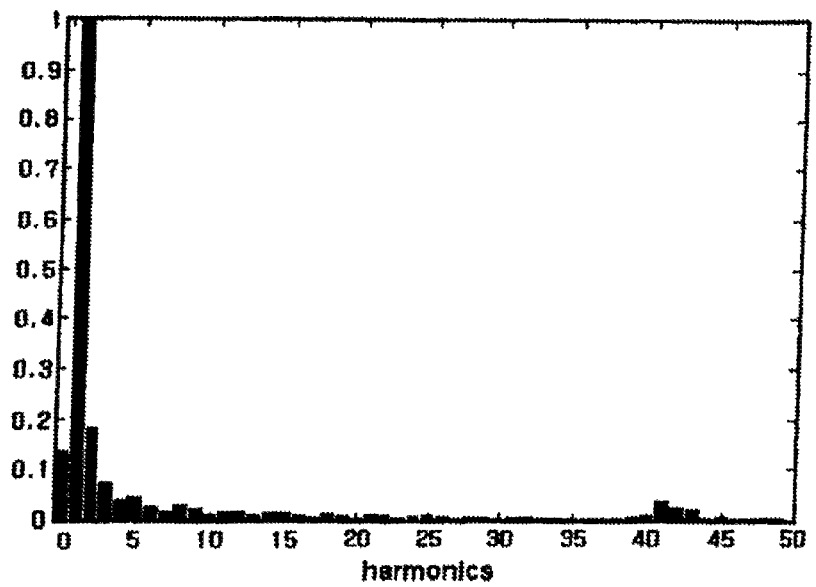
FIG. 7B is a diagram showing, the magnitude of each harmonic based on the FFT analysis of the output current waveform.

FIG. 7 shows an output current waveform obtained through analysis using simulation (on the top) and the magnitude of each harmonic obtained through FFT analysis (on the bottom) in the case in which the semi-conductor switching elements S1 to S6 or the control circuit are aged or an element is not normally switched due to the failure of a control power source for supplying power to the control circuit (for example, a DC/DC converter or an SMPS), as described above. It can be seen that, in this case, a plurality of low order harmonics, which is specific order harmonics having frequencies lower than a switching frequency, occurs in the output current of the inverter switching module 102.

Figure 8A:
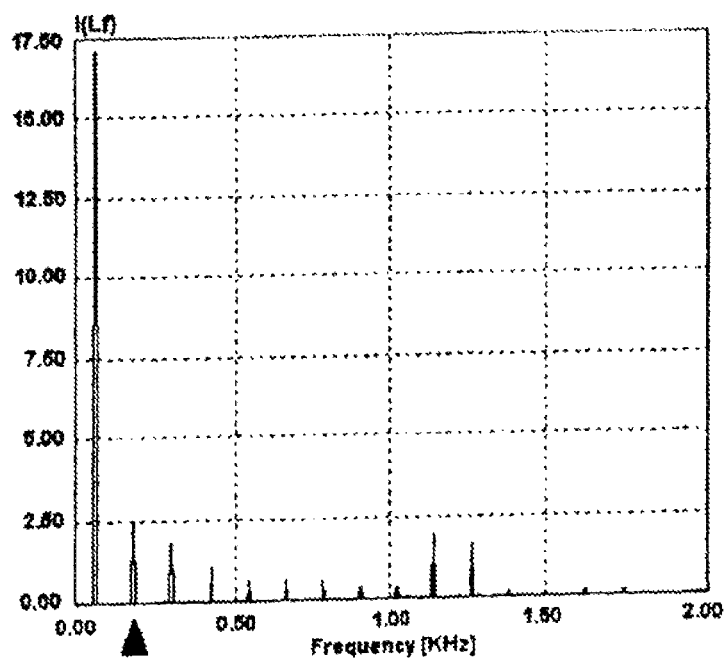
FIG. 8A is a diagram showing an output current waveform when the inverter switch module is normally operated.
Figure 8B:
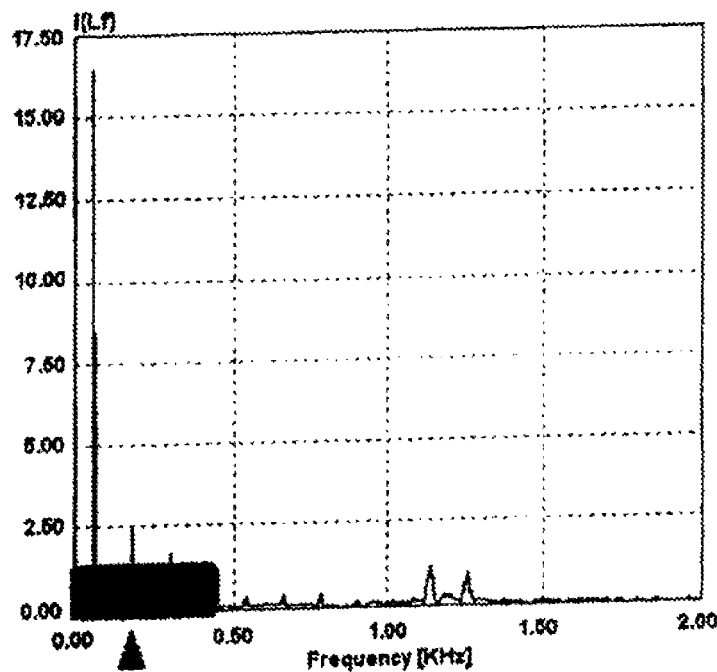
FIG. 8B is a diagram showing the magnitude of each harmonic based ran the FTT analysis of the output current waveform, related to another example of an aging phenomenon, when the inverter switch module is normally operated.

FIG. 8 shows the magnitude of each harmonic obtained through FFT analysis (on the top) and an output current waveform during a normal operation (on the bottom) in the case when the aging of an inverter switch module, which is an example of an aging phenomenon, has occurred. It can be seen that, in this case, a plurality of subharmonics or interharmonics, which is specific order harmonic having frequency lower than the switching frequency, occurs in the output current of the inverter switching module 102.

With regard to the inverter switching module 102, since the types of failures are various and the extent of aging of each part is various because the circuit configuration of the power conversion system is complicated, only one of the average value and the magnitude (or effective value) of each harmonic of the output current of the inverter switching module 102 can vary according to various circuit failure factors or aging factors. As a result, measurement discrimination can be increased by examining characteristics, such as the PWM control method of the power conversion system, and then analyzing only one of the output current average value and the magnitude (or effective value) of each harmonic or analyzing and monitoring the output current average value and the magnitude (or effective value) of each harmonic, in consideration of the operational characteristics.

Meanwhile, the electrolytic capacitor connected to the DC bus of the power conversion system is a part the durable life of which varies with operating conditions (particularly, operating temperature) and which has a relatively short durable life. Accordingly, it is essential to continuously monitor the aging state thereof.

In the electrolytic capacitor, as aging and deterioration progress, three factors vary in general. The three factors are capacitance capacity variation, Equivalent Series Resistance (ESR) variation and leakage current value variation. With regard to the capacitance capacity of the electrolytic capacitor expressed in faradays, an electrolytic component gradually decreases due to aging and deterioration, with the result that the capacitance capacity decreases and the ESR value decreases.

Furthermore, since the capacitance capacity varies with the temperature of the electrolytic capacitor, variation in loss angle tan δ, which is the ratio of the capacitance capacity and the ESR value, is calculated, and then whether or not the variation is equal to or greater than a predetermined value (for example, the capacitance capacity varies at about −20%∼+20%) is set as a diagnostic criterion. In particular, since there are many cases in which manufacturers propose that degradation is determined to occur if the loss angle tan δ is less than 300% of an initial reference value, it is preferable to check variation in loss angle tan δ.

Meanwhile, in order to detect the abnormality of the charging, it is preferred that the present invention further include the step of analyzing the harmonic component of the ripple current of the electrolytic capacitor (which is a factor related to the abnormality or aging of the rectifying or charging or the aging of the electrolytic capacitor), detected through the third current sensing means, through FFT, and diagnosing whether the magnitude of each harmonic has been changed to a value equal to or greater than a reference value.

In an embodiment of the present invention, the measurement current generation means 112 generates a measurement current signal Is in a sine wave shape, a square wave shape or a ripple wave shape having a sine wave in response to On/Off signals from the control and calculation means 203. The generated measurement current signal Is flows through the + and − terminals of the DC bus electrolytic capacitor because DC stage voltage is blocked by the coupling of the signal isolation unit 113.

When the measurement current signal flows through the electrolytic capacitor, the DC voltage and relevant impedance voltage Vs are added to each other at the + and terminals of the electrolytic capacitor, the DC voltage component is eliminated by the DC coupling means 200, and the impedance voltage signal of the pure AC component passes through the filtering and amplification means and is converted into a digital signal through the A/D conversion unit 202.

Furthermore, the supplied measurement current signal Is is also converted into a digital signal at the A/D conversion unit 202, and the ESR value of the electrolytic capacitor to be measured and the loss angle tan δ, which is the ratio of the capacitance capacity to the ESR value, are calculated using the impedance voltage Vs and the measurement current signal Is.

Since the ESR value is the internal resistance component of the electrolytic capacitor, it may be expressed by the following Equation 1:

$$\text{ESR Value } (\mu\Omega) = (Vs/Is) \times \cos\delta \times 10^{-6} \quad (1)$$

where $\delta$ is the difference in phase angle between the measurement current measurement signal Is and its relevant impedance voltage Vs. Furthermore, $\cos\delta$ is expressed by the following Equation 2:

$$\cos\delta = \text{ESR Value } (\mu\Omega) \times (Is/Vs) \times 10^6 \quad (2)$$

Furthermore, since the loss angle $\tan\delta$ can be expressed by the following Equation 3, the ESR value $\mu\Omega$ and the loss angle $\tan\delta$ can be calculated therefrom.

$$\tan\delta = \sqrt{1/\cos^2\delta - 1} \quad (3)$$

In an embodiment of the present invention, the ESR value $\mu\Omega$ and the $\cos\delta$ value can be easily calculated using the synchronous detection calculation algorithm and the implementation circuit thereof, which were presented in Korean Patent No. 10-0577828-0000, filed on Feb. 3, 2004, issued on May 2, 2006 and entitled impedance effective value measuring method and the implementation circuit thereof robust to ripple noise signals.

In general, the impedance voltage Vs and the measurement current signal Is include various types of induced noise attributable to the operation of the power conversion system, and various order harmonics attributable to load current. As described above, even in the case in which an arbitrary harmonic component or a frequency similar to a fundamental frequency component is included in addition to the fundamental frequency components of the impedance voltage Vs and the measurement current signal Is, the ESR value $\mu\Omega$ and the $\cos\delta$ value can be calculated and the loss angle $\tan\delta$ can be accurately calculated using Equation 3, through the application of the synchronous detection calculation algorithm, which was presented in the cited invention.

In greater detail, when the internal ESR value $\mu\Omega$ of the electrolytic capacitor is calculated, a measurement signal, including (mixed with) a lot of noise induced to a target object due to external factors, such as impedance voltage $V_{IS}$ attributable to the measurement current signal Is and the high frequency ripple voltage $V_{RP}$, is acquired using a typical bandpass filter. In this case, the internal ESR value $\mu\Omega$ of the electrolytic capacitor and the $\cos\delta$ value can be accurately acquired through a synchronous detection calculation process, including a calculation process of appropriately setting the frequency of the measurement current signal Is to eliminate the influence of the noise and performing integration using a specific appropriately selected and optimally set integral period $T_D$ to remove all AC component terms.

Assuming that the frequency of the measurement current signal Is is n$\omega$, the impedance voltage Vs signal acquired from the electrolytic capacitor of a object to be measured in conformity with the measurement current signal Is is generally expressed by the following Equation 4:

$$V_s = v(t) = 2A\cos(\omega t + \Phi + \delta) \quad (4)$$

In the present invention, the $\delta$ value is the difference in phase angle between the measurement current signal Is and the relevant impedance voltage $V_{IS}$, which is used to calculate the internal ESR value $\mu\Omega$ of the electrolytic capacitor. Meanwhile, the measurement current signal Is can be expressed by a sine function, as indicated by the following Equation 5. The measurement current signal Is includes various types of induced noise signals or various order harmonics attributable to switching noise.

$$I_s = i(t) = 2B\cos(\omega t + \Phi) \quad (5)$$

According to the well-known synchronous detection calculation method, respective calculation terms $m_1$, $m_2$, $m_3$ and $m_4$ are obtained by multiplying impedance voltage $V_{IS}$ or measurement current signal Is, including various types of harmonic signals, by a cosine wave $C_1$ or a sine wave $S_1$, having a frequency identical to that of the impedance voltage $V_{IS}$ and a phase difference of a certain angle $\Phi$, the greatest common divisor is obtained for the frequencies of all AC component terms of each of the calculation terms, a period corresponding to the greatest common divisor or an integer multiple of the period is set as an integral period $T_D$, and periodic integration is performed over the integral period $T_D$ on the respective calculation terms $m_1$, $m_2$, $m_3$ and $m_4$. As a result, all AC component terms are removed from each of the calculation terms, the values of DC components $M_1$, $M_2$, $M_3$ and $M_4$ required for the calculation of the ESR value is obtained, and the ESR value $\mu\Omega$ can be calculated using Equations 1 and 6:

$$\frac{(M_1 M_4 + M_2 M_3)}{M_2^2 + M_4^2} = \frac{A}{\sqrt{2}} \frac{1}{\frac{B}{\sqrt{2}}} \cos(\delta) = \frac{Vs}{Is}\cos(\delta) \quad (6)$$

Furthermore, the $\cos\delta$ value is calculated using the following Equation 7:

$$\frac{(M_1 M_4 + M_2 M_3)}{\sqrt{M_1^2 + M_3^2}\sqrt{M_2^2 + M_4^2}} = \cos\delta \quad (7)$$

Thereafter, the loss angle $\tan\delta$ may be calculated using Equation 7 and Equation 3.

Figure 3:
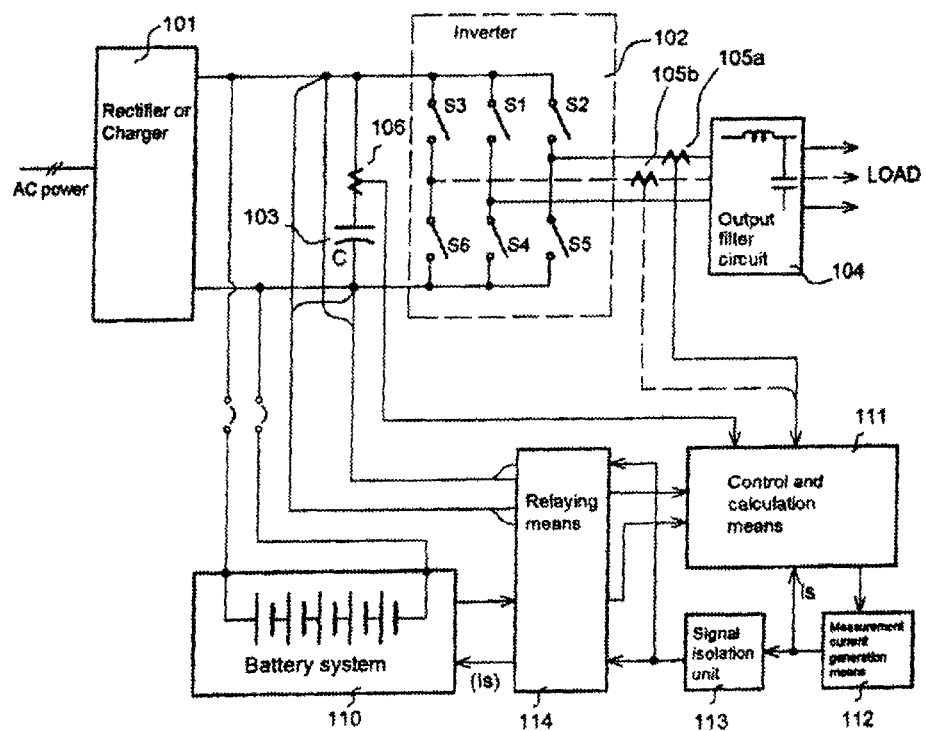
FIG. 3 is a configuration diagram of an aging status diagnostic apparatus for a power conversion system according to another embodiment of the present invention.

Meanwhile, FIG. 3 shows another embodiment of the present invention that is configured to further include a relaying means 114 for, in order to measure and diagnose the aging state of a battery system, which is an essential part of an Uninterrupted Power Supply (UPS), switching a measurement current signal Is, generated by the measurement current generation means 112, to the battery system to be measured and connecting the internal impedance voltage signal of the battery to be measured to the measurement and diagnosis means 211.

The impedance voltage Vs signal is obtained from the battery to be measured by causing the measurement current signal Is, generated by the measurement current generation means 112, to flow through the battery system to be measured, and the internal impedance effective value (resistance component) of the battery to be measured can be calculated using a method similar to the above-described method of calculating the internal ESR value $\mu\Omega$ of the electrolytic capacitor.

Furthermore, the frequency of the measurement current signal Is generated by the measurement current generation means 112 to calculate the internal impedance effective value (resistance component) of the battery to be measured may be set to the frequency of the measurement current signal Is used to calculate the internal ESR value $\mu\Omega$ of the electrolytic capacitor, or to a different appropriate frequency in consideration of the internal equivalent circuit characteristics of the battery to be measured. Meanwhile, the magnitude of the measurement current signal Is may be set to the same or different magnitude.

When the capacity of a battery system is high, the number of batteries (cells) of the battery system is more than several hundreds, in which case sensing circuits must be installed for respective cells to measure the aging state of the respective cells, with the result that the installation of the sensing circuits is complicated and a large number of monitoring circuits is required, thus resulting in complication. For the increase in economic effect, a method of dividing a battery system to be measured into groups having an appropriate size, measuring an internal impedance effective value (resistance component) and voltage for each of the groups and diagnosing the aging state thereof may be more preferable.

Figure 4:
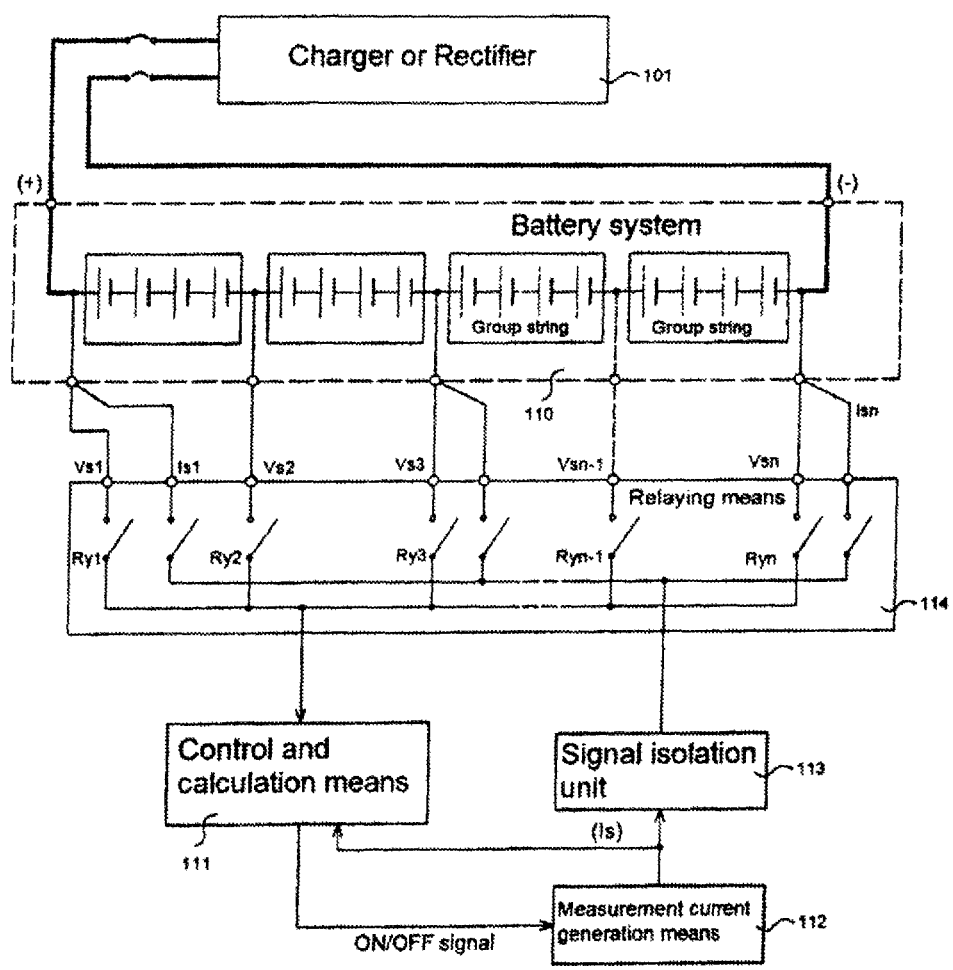
FIG. 4 is a diagram showing the connection between the series unit blocks of a battery system in a power conversion system.

FIG. 4 shows a connection diagram of an embodiment capable of measuring internal resistance and voltage for each group and diagnosing the aging state thereof.

In greater detail, FIG. 4 shows a connection diagram in which a battery system to be measured 110 is divided into an appropriate number of groups and the connection of measurement current signal supply lines Is1~Isn and characteristic data sensing signal lines Vs1~Vsn capable of measuring internal resistance and voltage for each of the groups is illustrated. In practice, 4~12 cells are grouped into each group in consideration of the number of series strings, and measurement current and data sensing signal lines, formed of a four-terminal network, are connected to each of the groups to measure internal resistance and cell voltage.

Although, in FIG. 4, each string group is composed of 4 cells, each measurement current signal line is connected to two neighboring groups so that a measurement current signal can flow to the two string groups, and the number of groups to which an independent measurement current signals Is can flow may be appropriately selected in consideration of the capacity of the measurement current generation means 111 and difficulty in the wiring of the current signal supply lines.

In order to calculate the internal ESR value $\mu\Omega$ and $\cos\delta$ value of the electrolytic capacitor or the internal resistance of each battery cell/group to be measured, a measurement and calculation step or method based on the synchronous detection calculation algorithm may be configured as descried below, as an embodiment.

A measurement current signal Is and a relevant impedance voltage Vs signal are detected by causing a measurement current signal to flow through a object to be measured at step S301;

Here, it is preferable to filter out only frequency components necessary for measurement calculation from the signal frequency component of the measurement current signal and the impedance voltage through the execution of the internal filtering program steps or filer means or a measurement calculation device at step S302;

Thereafter, the MPU reads the detection signals converted into digital signals, and calculates the internal ESR value $\mu\Omega$ and loss angle $\tan\delta$ of the electrolytic capacitor or the internal resistance value of the battery cell/group to be measured using the measurement signal components of the obtained measurement current signal and the impedance voltage at step S303.

Meanwhile, a method of calculating the internal ESR value $\mu\Omega$ and the loss angle $\tan\delta$ or the internal resistance value of each battery cell/group will be described below.

The greatest common divisor of result values obtained through the addition and subtraction of all frequency components constituting the measurement signal at step S304

A period corresponding to the frequency of the greatest common divisor or an integer multiple of the period is set as a predetermined integral period $T_D$ necessary for calculation at step S305.

The calculation terms $m_1$, $m_2$, $m_3$ and $m_4$ are respectively calculated from the measurement current signal, the impedance voltage signal, the cosine wave C1 and the sine wave S1 at step S306.

The calculation terms $M_1$, $M_2$, $M_3$ and $M_4$, including only DC components, are respectively obtained by integrating the calculation terms $m_1$, $m_2$, $m_3$ and $m_4$ over the predetermined integral period $T_D$ at step S307.

The internal ESR value $\mu\Omega$ and loss angle $\tan\delta$ of the electrolytic capacitor or the internal resistance value of the battery cell/group to be measured are calculated from the calculation terms $M_1$, $M_2$, $M_3$ and $M_4$ at step S308

Figure 5:
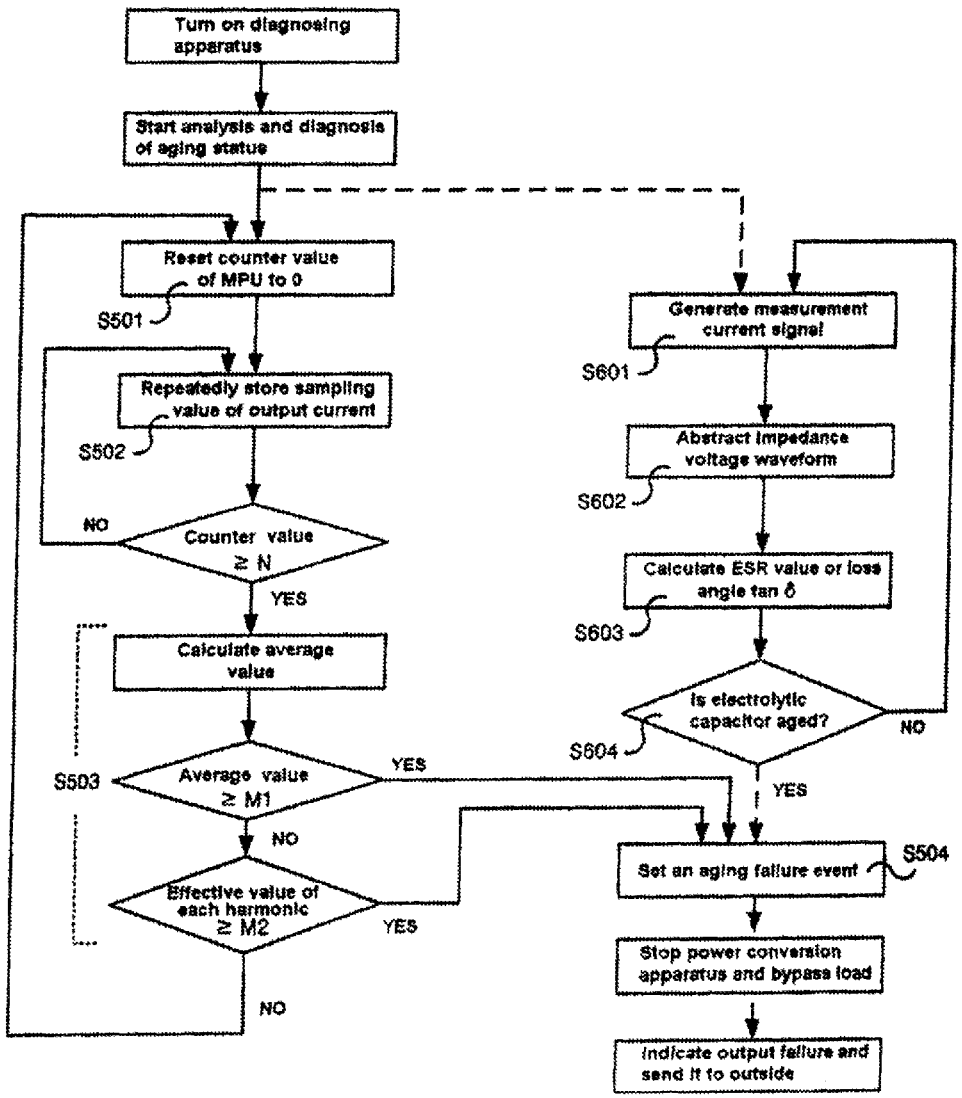
FIG. 5 is a diagram showing the flow of the output current of an inverter switch module in respective stages in a power conversion system.

FIG. 5 is a flowchart of an internal program that is configured to implement the method of diagnosing the aging state of a power conversion system in such a way as to calculate the average value of the output current of the inverter switching module 102, which is an embodiment of the present invention, or/and the magnitude or effective value of a harmonic based on FFT and calculate the ESR value and loss angle $\tan\delta$ of the electrolytic capacitor. This will be described in detail below.

When the measurement and diagnosis means 211 is turned on, the process enters a calculation loop for diagnosing the abnormality and aging state of the power conversion and the counter n of the MPU is reset to 0 at step S501.

In order to measure the output current waveform of the first or second output current sensing means 105a or 105b, an output current sampling value obtained through the filtering and amplification means 201 over a half period or one period is input to the A/D conversion unit 202, and an output current digital value obtained through conversion is stored in the memory of the control and calculation means 203, which is repeated until the counter reaches N at step S502.

An average value over one period is calculated using the stored current waveform, and then the magnitude or effective value of each specific order harmonic over upper and lower half periods (that is, one period) is calculated using FFT. When at least one of the average value, and the magnitude and effective value of each harmonic respectively exceeds predetermined set values M1 and M2, a relevant event bit is set at step S503.

When the relevant event bit is set, it is sent to a data collection device or server and notifies the data collection device or the server of whether the abnormality or failure of the power conversion system occurs at step S504.

Furthermore, in order to ensure the reliability of a diagnosis while simplifying calculation, as at step S503, if any one of the average value, and the magnitude and effective value of a specific harmonic respectively exceeds the predetermined set value M1 or M2, the abnormality or aging of the power conversion system is determined to occur, and thus the operation of the apparatus may be stopped.

In another embodiment, it is preferable to check whether the average value and the magnitude or effective value of the specific harmonic exceed the predetermined reference values M1 and M2, respectively, in consideration of the above characteristics depending on the determination of a designer because the output current waveform level or state of the filtering and amplification means 201 may be extracted differently depending on the failure state or aspect of the power conversion system.

That is, if the average value and the magnitude or effective value of the specific harmonic do not exceed the predetermined values M1 and M2, respectively, the operation of the power conversion system is continuously performed at step S505.

If an abnormality is found in the above case, load is immediately bypassed, the operation of the power conversion system is stopped, and an error flag is set up, output to the output display means and sent to the data collection device or the server at step S506.

Furthermore, a method of calculating the ESR value of the electrolytic capacitor and loss angle tan δ, which is the ratio of the capacitance capacity to the ESR value includes causing a measurement current signal having a predetermined frequency to flow through the electrolytic capacitor connected to the DC bus of the power conversion system at step S601; extracting an impedance voltage waveform corresponding to the measurement current signal at step; calculating an ESR value or loss angle tan δ from the measurement current signal and the extracted impedance voltage waveform at step S603; and diagnosing the erroneous operation of the power conversion system or the aging of the electrolytic capacitor based on the calculated ESR value or loss angle tan δ at step S604. If the erroneous operation or aging is found at the above step, the load is immediately bypassed, the operation of the power conversion system is stopped, and an error flag is set, output to the output display means and set to the data collection device or the server.

Furthermore, a method of measuring and monitoring the aging state of a battery system, which is an essential part of a UPS, includes selectively controlling the relaying means to switch a battery group or cell to be measured to the measurement and diagnosis means; causing a measurement current signal having a predetermined frequency to flow through the battery group or cell to be measured selected by the relaying means; extracting an internal impedance voltage waveform corresponding to the measurement current signal; calculating an internal resistance value from the measurement current signal and the extracted internal impedance voltage waveform; and determining the aging state of the battery system based on the calculated internal resistance value. At the step of extracting the internal impedance voltage waveform, the measurement and calculation of the battery cell voltage is performed together.

A detailed implementation method or a circuit thereof for calculating the internal resistance of each cell or group of the battery system to be measured and voltage for each group and diagnosing the degradation state thereof may be easily implemented using the technical spirit of Korean Patent No. 10-0546246, filed on Apr. 23, 2003 by the present applicant in Korea, registered on Jan. 19, 2006, and entitled system for diagnosing degradation of battery system.

The above-described preferred embodiments of the present invention are disclosed for the purpose of illustration, and it is possible to manufacture an online diagnosis and monitoring apparatus by adding a serial communication or TCP/IP communication module to the above apparatus while utilizing the technical spirit of the present invention and mount and use it on a power conversion system in operation.

Furthermore, the present invention may be implemented in a portable form on the basis of the technical spirit thereof, and the erroneous operation or abnormal state of each portion can be accurately diagnosed by measuring the portion of a power conversion system in operation using a four-terminal network measuring probe and a current sensing means.

Furthermore, it will be apparent to those skilled in the art to which the present invention pertains that various substitutions, modifications and variations are possible within a range that does not depart from the technical spirit of the present invention. It should be considered that such substitutions, modifications and variations fall with the following claims.

Although the preferred embodiments of the present invention have has been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

Currently, UPSs are the main stream of power conversion systems. The usage or purpose of such a UPS is to charge a battery with power at normal times in the case of a power failure in a commercial line and convert power, with which the battery is charged, into AC power and compensate for the power failure. Since an unexpected accident related to the present apparatus causes a power failure and thus results in economic and social losses, the preemptive monitoring of an aging state is inevitably required in order to prevent an unexpected accident during the operation of the apparatus.

The present invention has advantages in that the erroneous operation or damage of a power conversion system can be accurately monitored and the occurrence of aging (degradation) can be diagnosed in advance by locally and remotely monitoring a normal state attributable to the aging or degradation of equipment in real time.

Furthermore, the present invention can be easily applied to a power conversion system in operation in such a way as to connect sensing lines, formed of a four-terminal network, to a portion of the power conversion system in operation near a DC bus and install a current sensing means in the output circuit stage of the inverter switching module in a hook form.

Furthermore, the present invention can increase the accuracy or discrimination of the diagnosis of the aging of a power conversion system through the extraction of the current waveforms of characteristic components related to the loss angle of an electrolytic capacitor or/and the aging of a switching semiconductor device (the electrolytic capacitor and the switching semi-conductor device are portions that belong to parts of the power conversion system and may be degraded early), which are not present in the conventional methods, compared with the conventional methods.

Furthermore, signal analysis or calculation may be selectively simplified depending on the determination of a designer, and reliability can be achieved because measurement discrimination is high.

The invention claimed is:

1. An aging status diagnostic apparatus for a power conversion system, comprising:
   an output current sensing means installed on an output stage line of an inverter switching module of the power conversion system, and configured to detect output current of the inverter switching module; and
   a measurement and diagnosis means configured to receive the output current of the inverter switching module from the output current sensing means, calculate one or more of an average value of the output current over one period, and magnitude or an effective value of each harmonic of the output current, and determine whether aging of the inverter switching module has occurred,
   wherein the measurement and diagnosis means determines that the aging of the inverter switching module of the power conversion system has occurred if the average value of the output current over one period increases by a value equal to or greater than a predetermined range and/or an even order harmonic or a specific order harmonic based on FFT of the output current increases by a value equal to or greater than a predetermined range.

2. The apparatus as set forth in claim 1, wherein the measurement and diagnosis means comprises:
an analog-to-digital (A/D) conversion unit for converting an output current signal, received from the output current sensing means, into a digital signal, and outputting the digital signal to a control and calculation means; and
the control and calculation means for calculating one or more of an average value of the output current signal over one period from the A/D conversion unit, and the magnitude and effective value of the harmonic based on Fast Fourier Transform (FFT) of the output current, and determining whether the aging of the inverter switching module of the power conversion system has occurred.

3. The apparatus as set forth in claim 2, wherein the measurement and diagnosis means further comprises a filtering and amplification means for filtering out noise components or noise signals in an unnecessary frequency band included in the output current, or buffering, amplifying or shifting a signal level of the output current.

4. The apparatus as set forth in claim 3, wherein the measurement and diagnosis means further comprises:
an output display means for outputting results of the calculation of the control and calculation means; or
a communication port for receiving an output signal related to results of the calculation of the control and calculation means and sending the output signal to an external monitoring device.

5. The apparatus as set forth in claim 2, wherein the measurement and diagnosis means further comprises:
an output display means for outputting results of the calculation of the control and calculation means; or
a communication port for receiving an output signal related to results of the calculation of the control and calculation means and sending the output signal to an external monitoring device.

6. The apparatus as set forth in claim 1, wherein the specific order harmonic comprises a plurality of lower order harmonics.

7. The apparatus as set forth in claim 1, wherein the specific order harmonic comprises a plurality of subharmonics or interharmonics.

8. An aging status diagnostic apparatus for a power conversion system, comprising:
a measurement current generation means connected to + and − terminals of a DC bus electrolytic capacitor of the power conversion system, and configured to generates a measurement current signal to be supplied to the DC bus electrolytic capacitor;
a signal isolation unit configured such that the measurement current signal generated by the measurement current generation means is blocked from DC stage voltage and flows through the electrolytic capacitor;
a measurement and diagnosis means configured to calculate one or more of an Equivalent Series Resistance (ESR) value and a loss angle of the electrolytic capacitor by using the measurement current signal generated by the measurement current generation means, and an impedance voltage signal induced to the electrolytic capacitor by the measurement current signal, and determine whether aging of the DC bus electrolytic capacitor of the power conversion system has occurred; and
a ripple current sensing means for detecting ripple current of the DC bus electrolytic capacitor;
wherein the measurement and diagnosis means receives the ripple current from the ripple current sensing means, calculates the magnitude of each harmonic based on FFT of the ripple current, and determines whether the aging of the DC bus electrolytic capacitor of the power conversion system has occurred based on the calculated magnitude of the harmonics.

9. The apparatus as set forth in claim 8, wherein the measurement and diagnosis means comprises:
a DC coupling means for filtering out only an AC component signal from impedance voltage obtained from the + and − terminals of the DC bus electrolytic capacitor;
an A/D conversion unit for converting an impedance voltage signal of the AC component, the measurement current signal and the ripple current into digital signals, and outputting the digital signals to a control and calculation means; and
the control and calculation means for calculating an Equivalent Series Resistance (ESR) value or loss angle of the electrolytic capacitor by using the impedance voltage signal, the measurement current signal and the ripple current from the A/D conversion unit, or a magnitude of each harmonic based on FFT of the ripple current, and determining whether the aging of the DC bus electrolytic capacitor has occurred,
wherein the control and calculation means determines that the aging of the DC bus electrolytic capacitor of the power conversion system has occurred if the ESR value or the loss angle increases by a value equal to or greater than a predetermined range and/or magnitude of each harmonic based on FFT of the ripple current increases by a value equal to or greater than a predetermined range.

10. The apparatus as set forth in claim 9, wherein the measurement and diagnosis means further comprises:
an output display means for outputting calculation results of the control and calculation means; or
a communication port for receiving an output signal related to the calculation results of the control and calculation means and sending the output signal to an external monitoring device.

11. The apparatus as set forth in claim 9, wherein the measurement and diagnosis means further comprises:
an output display means for outputting results of the calculation of the control and calculation means; or
a communication port for receiving an output signal related to the calculation results of the control and calculation means and sending the output signal to an external monitoring device.

12. The apparatus as set forth in claim 8, wherein the measurement and diagnosis means comprises:
a DC coupling means for filtering out only an AC component signal from impedance voltage obtained from + and − terminals of the DC bus electrolytic capacitor;
an A/D conversion unit for converting an impedance voltage signal of the AC component signal and the measurement current signal into digital signals and outputting the digital signals to a control and calculation means; and
the control and calculation means for calculating an ESR value or loss angle of the electrolytic capacitor by using the impedance voltage signal and the measurement current signal output from the A/D conversion unit, and determining whether aging of the DC bus electrolytic capacitor has occurred using results of the calculation,
wherein the control and calculation means determines that the aging of the DC bus electrolytic capacitor of the power conversion system has occurred if the ESR value increases by a value equal to or greater than a predetermined range and/or the loss angle increases by a value equal to or greater than a predetermined range.

13. A method of diagnosing an aging state of a power conversion system in an aging status diagnostic apparatus for the power conversion system, comprising the steps of:
- (a) in the aging status diagnostic apparatus, detecting output current of an inverter switching module of the power conversion system; and
- (b) calculating one or more of an average value of the output current of the inverter switching module over one period, and magnitude or an effective value of each harmonic of the output current, and determining whether aging of the inverter switching module of the power conversion system has occurred based on results of the calculation, wherein the step (b) comprises the steps of:
- (b-1) converting the detected output current into a digital signal; and
- (b-2) calculating one or more of an average value of the output current, converted into the digital signal, over one period, and magnitude or an effective value of each harmonic based on FFT of the output current, and determining whether the aging of the inverter switching module of the power conversion system has occurred, and wherein the step (b-2) comprises determining that the aging of the inverter switching module of the power conversion system has occurred if the average value of the output current over one period increases by a value equal to or greater than a predetermined range and/or magnitude or effective value of an even order harmonic or a specific order harmonic based on FFT of the output current increases by a value equal to or greater than a predetermined range.

14. The method as set forth in claim 13, wherein the specific order harmonic comprises a plurality of lower order harmonics.

15. The method as set forth in claim 13, wherein the specific order harmonic comprises a plurality of subharmonics or interharmonics.

16. A method of diagnosing an aging state of a power conversion system in an aging status diagnostic apparatus for the power conversion system, comprising the steps of:
- (a) in the aging status diagnostic apparatus for the power conversion system, causing a measurement current signal having a predetermined frequency to flow through a DC bus electrolytic capacitor connected to a DC bus of the power conversion system;
- (b) extracting an impedance voltage waveform corresponding to the measurement current signal at + and − terminals of the electrolytic capacitor;
- (c) in the aging status diagnostic apparatus for the power conversion system, calculating one or more of an Equivalent Series Resistance (ESR) value and a loss angle tan δ of the electrolytic capacitor, and determining whether aging of the DC bus electrolytic capacitor has occurred;
- (d) in the aging status diagnostic apparatus for the power conversion system, detecting ripple current of the DC bus electrolytic capacitor; and
- (e) calculating magnitude of each harmonic based on FFT of the detected ripple current, and determining whether the aging of the DC bus electrolytic capacitor has occurred based on the magnitude of the harmonic.

17. The method as set forth in claim 16, wherein the step (c) comprises the steps of:
- (c-1) in the aging status diagnostic apparatus for the power conversion system, filtering out only frequency components necessary for measurement calculation from components of the measurement current signal and impedance voltage signal through filter means or execution of a filtering program;
- (c-2) converting an impedance voltage signal, a measurement current signal including a ripple current into digital signals; and
- (c-3) calculating one or more of an ESR value and a loss angle of the electrolytic capacitor by using the impedance voltage signal, the measurement current signal or the ripple current converted into the digital signals and magnitude of each harmonic based on FFT of the ripple current, and determining whether the aging of the DC bus electrolytic capacitor of the power conversion system has occurred based on results of the calculation, wherein the step (c-3) comprises determining that the aging of the DC bus electrolytic capacitor of the power conversion system has occurred if the ESR value or the loss angle increases by a value equal to or greater than a predetermined range and/or magnitude of each harmonic based on FFT of the ripple current increases by a value equal to or greater than a predetermined range.

18. The method as set forth in claim 16, wherein the step (c) comprises the steps of:
- (c-1) in the aging status diagnostic apparatus for the power conversion system, filtering out only frequency components necessary for measurement calculation from components of the measurement current signal and impedance voltage signal through filter means or execution of a filtering program;
- (c-2) converting an impedance voltage signal and a measurement current signal into digital signals; and
- (c-3) calculating an ESR value of the electrolytic capacitor by using the impedance voltage signal and the measurement current signal converted into the digital signals, and determining whether the aging of the DC bus electrolytic capacitor of the power conversion system has occurred based on the calculated ESR value.

19. The method as set forth in claim 16, further comprising, before or after the steps (a) to (c), the steps of:
- in the aging status diagnostic apparatus for the power conversion system,
- generating a measurement current signal having a frequency identical to that at a time of calculating the internal ESR value of the electrolytic capacitor, and causing the measurement current signal to flow through a battery to be measured; and
- measuring internal resistance of the battery while causing the measurement current signal determined at the above step to flow through the battery.

* * * * *